United States Patent [19]
Komuro

[11] Patent Number: 5,062,937
[45] Date of Patent: Nov. 5, 1991

[54] PROCESS FOR PREPARING AN INK JET HEAD

[75] Inventor: Hirokazu Komuro, Hiratsuka, Japan

[73] Assignee: Canon Kabushiki Kaisha, Tokyo, Japan

[21] Appl. No.: 279,056

[22] Filed: Dec. 2, 1988

[30] Foreign Application Priority Data

Dec. 2, 1987 [JP] Japan ............ 62-303264
Dec. 2, 1987 [JP] Japan ............ 62-303265
Dec. 2, 1987 [JP] Japan ............ 62-303266

[51] Int. Cl.[5] ............ C23C 14/34
[52] U.S. Cl. ............ 204/192.15; 204/192.16; 204/192.23; 346/140 R
[58] Field of Search ............ 204/192.15, 192.16, 204/192.17, 192.22, 192.23; 346/140 R

[56] References Cited

U.S. PATENT DOCUMENTS

| | | | |
|---|---|---|---|
| 4,567,493 | 1/1986 | Ikeda et al. | 346/140 R |
| 4,720,716 | 1/1988 | Ideda et al. | 346/140 R |
| 4,723,129 | 2/1988 | Endo et al. | 346/1.1 |
| 4,804,974 | 2/1989 | Sugata et al. | 346/76 PH |

FOREIGN PATENT DOCUMENTS

| | | |
|---|---|---|
| 2843064 | 4/1979 | Fed. Rep. of Germany . |
| 59936 | 5/1979 | Japan . |
| 194866 | 5/1984 | Japan . |
| 234850 | 11/1985 | Japan . |

OTHER PUBLICATIONS

B. Chapman, Glow Discharge Processes, John Wiley & Sons, New York, 1980, pp. 215-227.
L. I. Maissel, Handbook of Thin Film Technology, McGraw-Hill Book Co., New York, 1970, pp. 13-26 to 13-30.

*Primary Examiner*—John F. Niebling
*Assistant Examiner*—William T. Leader
*Attorney, Agent, or Firm*—Fitzpatrick, Cella, Harper & Scinto

[57] ABSTRACT

A process for preparing an ink jet head having a support, an electrothermal transducer provided on the support and having a heat-generating resistor and a pair of electrodes electrically connected to the heat-generating resistor, a first upper layer provided. on the electrothermal transducer, a second upper layer provided on the first upper layer and a liquid path communicated with a discharge opening for discharging liquid and formed on the support so as to correspond to the heat-generating portion of the electrothermal transducer formed between the pair of electrodes comprises the steps of:

forming the first upper layer by the bias sputtering method at the absolute value of the bias voltage of 50 V or less and forming the second upper layer by the bias sputtering method at the absolute value of the bias voltage higher than 50 V.

The upper layers may be made of a protective material. Suitable materials are metal oxides such as $SiO_2$, $TiO_2$, $WO_3$ and $Ta_2O_5$, and nitrides such as $Si_3N_4$ and AlN.

16 Claims, 3 Drawing Sheets

PROCESS FOR PREPARING AN INK JET HEAD

BACKGROUND OF THE INVENTION

1. Field of the Invention

This invention relates to an ink jet head to be used in an ink jet recording apparatus which performs recording by forming droplets of ink by discharging ink and attaching the droplets onto a recording medium such as paper, etc., a substrate for the head, processes for preparing thereof and an ink jet apparatus having the head.

2. Related Background Art

The ink jet recording method is a recording method which performs recording by discharging ink (recording liquid) from a discharge opening provided at the ink jet recording head and attaching the ink onto a recording medium such as paper, etc. The method has many advantages; it generates little noise, is capable of high speed recording, and yet recording can be practiced on plain paper, etc. without use of a special recording paper. Various types of recording heads have been developed.

Among them, the recording head of the type which discharges ink from a discharge opening by permitting heat energy to act on ink as disclosed in Japanese Laid-open Patent Application No. 54-59936, German Laid-open Patent Application (DOLS) No. 2843064 and U.S. Pat. No. 4,723,129 has such advantages as good response to recording signals, easy multi-formation of discharge openings, etc.

Representative constitutions of such a recording head of the type utilizing heat energy as the ink discharging energy are shown in FIGS. 1A and 1B.

The recording head has a constitution formed by bonding a substrate comprising an electrothermal transducer provided for transducing electrical energy to heat energy utilized for ink discharging arranged on the surface exhibiting insulating property of the support 1, and further, if necessary, an upper layer 4 as the protective layer provided at least on the heat-generating resistor 8 and the electrodes 3 of the electrothermal transducer to be finally positioned below the liquid path 6 and the liquid chamber 10 communicated with the ink supplying inlet 9 to a covering member 5 having a recessed portion for forming the liquid path 6 and the liquid chamber 10, etc. formed thereon.

The energy to be utilized for discharging ink in this recording head is imparted by an electrothermal transducer having a pair of electrodes 3 and a heat-generating resistor 8 positioned between the pair of electrodes. That is, when current is applied on the electrodes 3 to generate heat from the heat-generating resistor, the ink in the liquid path 6 near the heat-generating portion 8 is momentarily heated to generate bubbles thereat, and through volume change by momentary volume expansion and shrinkage by generation of the bubbles, a droplet of ink is discharged.

The upper layer as the protective layer to be provided on the heat generating resistor and electrodes of the substrate in the constitution of the recording head as described above is provided for the purpose of preventing galvanic corrosion or electrical dielectric failure at the heat generating resistor or electrodes by contact with ink or penetration of ink, and it must be free from defect and good in step coverage.

From such standpoint, various investigations have been made about the materials for constituting the upper layer and the methods for formation thereof.

For example, Japanese Laid-open Patent Application No. 60-234850 discloses a constitution using a layer formed by the bias sputtering method for the upper layer.

By forming thus the upper layer according to the bias sputtering method, defects are reduced, step coverage becomes better, and durability is improved. Also, as compared with the sputtering method, the defects can be reduced even with the same thickness, and therefore the film thickness can be made thinner. Accordingly, improvement of characteristics and cost down can be effected.

Whereas, in formation of the upper layer according to the bias sputtering method, there still remain problems to be solved. For example, in the recording head prepared by use of a substrate provided with an upper layer having a bias sputtered layer, defects such as poor printing or lowering in durability are liable to occur.

Whereas, when a layer formed by the bias sputtering method (bias sputtered layer) is used for at least one layer of the protective films made to have a multi-layer constitution in order to give functionally more characteristics as disclosed in Japanese Laid-open Patent Application No. 59-194866, there ensued the problem that a protective film of good protective function cannot necessarily be obtained.

For example, when an inorganic insulating material layer such as $SiO_2$ is formed by the bias sputtering method, and further a high melting metal such as Ta is laminated thereon according to the sputtering method, cracks are remarkably generated particularly at the step portion (step difference portion in patterns of layer of electrodes), and peel-off of the protective layer is liable to occur at that portion, and also in the recording head prepared by use of a substrate having such constitution, breaking of electrodes and heat-generating resistors at low voltage may occur, whereby reliability is inferior and also durability in durability test such as step stress test may be low.

Thus, when a bias sputtered layer is used as the protective layer, paticularly when it is made a multi-layer constitution, not only the advantage of using the bias sputtered layer cannot be fully utilized, but also there is a problem that no protective layer of good quality can be formed.

SUMMARY OF THE INVENTION

An object of the present invention is to enable effective application of a bias sputtered layer to the protective layer.

Another object of the present invention is to provide an ink jet head provided with a protective layer having a bias sputtered layer, having high reliability and excellent durability, a substrate for the head, processes for preparing thereof and an ink jet apparatus provided with the head.

According to the first aspect of the present invention, there is provided a process for preparing an ink jet head having a support, an electrothermal transducer provided on the support and having a heat-generating resistor and a pair of electrodes electrically connected to the heat-generating resistor, a first upper layer provided on the electrothermal transducer, a second upper layer provided on the first upper layer and a liquid path communicated with a discharge opening for discharging liquid and formed on the support so as to correspond to the heat-generating portion of the electrothermal transducer formed between the pair of electrodes, which comprises the steps of:

forming the first upper layer by the bias sputtering method at the absolute value of the bias voltage of 50 V or less and forming the second upper layer by the bias sputtering method at the absolute value of the bias voltage higher than 50 V.

According to the second aspect of the present invention, there is provided a process for preparing a substrate for ink jet heads having a support, an electrothermal transducer provided on the support and having a heat-generating resistor and a pair of electrodes electrically connected to the heat-generating resistor, a first upper layer provided on the electrothermal transducer and a second upper layer provided on the first upper layer, which comprises the steps of:

forming the first upper layer by the bias sputtering method at the absolute value of the bias voltage of 50 V or less and forming the second upper layer by the bias sputtering method at the absolute value of the bias sputtering method at the absolute value of the bias voltage higher than 50 V.

According to the third aspect of the present invention, there is provided a process for preparing an ink jet head having a support, an electrothermal transducer provided on the support and having a heat-generating resistor and a pair of electrodes electrically connected to the heat-generating resistor, an upper layer provided on the electrothermal transducer and a liquid path communicated with a discharge opening for discharging liquid and formed on the support so as to correspond to the heat-generating portion of the electrothermal transducer formed between the pair of electrodes, which comprises the step of subjecting the upper layer to an annealing treatment.

According to the fourth aspect of the present invention, there is provided a process for preparing a substrate for ink jet heads having a support, an electrothermal transducer provided on the support and having a heat-generating resistor and a pair of electrodes electrically connected to the heat-generating resistor and an upper layer provided on the electrothermal transducer, which comprises the step of subjecting the upper layer to annealing treatment.

According to the fifth aspect of the present invention, there is provided an ink jet head comprising a support, an electrothermal transducer provided on the support and having a heat-generating resistor and a pair of electrodes electrically connected to the heat-generating resistor, an upper layer provided on the electrothermal transducer and having a residual stress when the compressive stress is expressed in terms of a minus of $-2.5\times10^9$ dyn/cm$^2$ or higher and a liquid path communicated with a discharge opening for discharging liquid and formed on the support so as to correspond to the heat-generating portion of the electrothermal transducer formed between the pair of electrodes.

According to the sixth aspect of the present invention, there is provided a substrate for ink jet heads comprising a support, an electrothermal transducer provided on the support and having a heat-generating resistor and a pair of electrodes electrically connected to the heat-generating resistor and an upper layer provided on the electrothermal transducer and having a residual stress when the compressive stress is expressed in terms of a minus of $-2.5\times10^9$ dyn/cm$^2$ or higher.

DESCRIPTION OF THE PREFERRED EMBODIMENTS

The present invention has been accomplished on the basis of the findings as described below.

That is, it has been analyzed and investigated about the cause for such defects, and consequently found that the frequency of occurrence of the defect as described above depends on the operation conditions of bias sputtering, particularly the bias voltage to obtain the conclusion that an ink jet recording head and a substrate to be used for preparation thereof of good quality can be prepared by layer formation according to the bias sputtering method in which different bias sputtering steps with the respective specified operational conditions are used, thus accomplishing the present invention.

The bias sputtering method is a method in which the base plate for film formation is lowered in potential lower than GND simultaneously with lowering the target side in potential lower than GND (sputtering method). More specifically, simultaneously with sputtering of, for example, Ar ions ($Ar+$) on the target side, the side of the base plate for film formation is also sputtered (sputter etching).

Figure 1A:
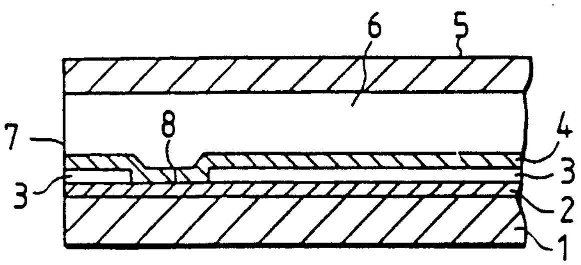
FIG. 1A PRIOR ART
FIG. 1A is a schematic partial sectional view taken along the liquid path in an example of an ink jet head.
Figure 1B:
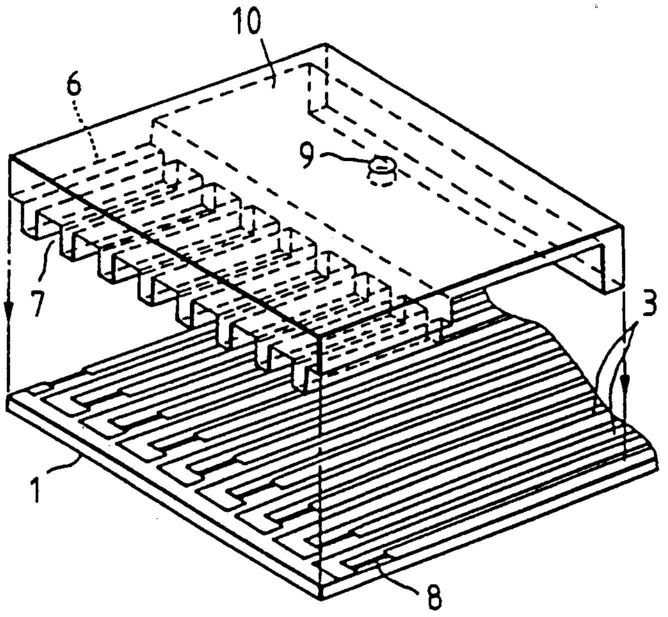
FIG. 1B PRIOR ART
FIG. 1B is a schematic perspective view showing the appearance of an example of an ink jet head in a separated state.

Whereas, in film formation according to the bias sputtering method, since the base plate for film formation is subjected to sputter etching, if film formation is performed by use of a base plate for film formation having an electrothermal transducer formed on a support as shown in FIG. 1, there are times when damage occurs to the electrothermal transducer on the support.

Particularly, the heat-generating resistor layer is formed as a very thin film in many cases, and when the heat-generating resistor layer is locally sputter etched to cause reduction in film thickness at that portion, no film thickness as designed will be consequently obtained in the heat-generating resistor and the recording head by use of the substrate thus prepared is liable to cause local power concentration in the heat-generating resistor during driving, thereby causing lowering in durability.

Such defects will become more marked as the bias voltage is increased.

However, for obtaining an upper layer having good step coverage as well as excellent functions, the bias voltage is required to be set higher, and if the bias voltage is made lower, there sometimes ensues the problem particularly in the step coverage itself of the upper layer.

The relationship between such bias voltage and the quality of the substrate for the recording head has been analyzed, and consequently found that the problems as described above can be cancelled by forming the bias sputtered layer under the operational conditions in which specific different bias sputtering steps are combined.

More specifically, in the method of the present invention, on the surface of the substrate on which an electrothermal transducer is provided, a bias sputtered layer by use of a low bias voltage is formed, and then on the bias sputtered layer thus formed, a bias sputtered layer by use of a high bias voltage necessary primarily for obtaining good step coverage is laminated.

The voltage to be used in the first bias sputtering step by use of a low bias voltage may be desirably 50 V or lower, preferably 20 V or lower in terms of absolute value, while the voltage to be used in the second sputtering step by use of a high bias voltage may be desirably 70 V or higher, preferably 100 V or higher in terms of absolute value.

By such bias sputtering process divided into at least 2 steps, an upper layer having good step coverage and adhesion as well as good function can be formed without affecting deleteriously the electrothermal transducer on the substrate. More specifically, in the first bias sputtering step of a low voltage, the bias voltage is sufficiently low and therefore no damage will occur to the electrothermal transducer on the substrate at all. Further, in the second bias sputtering step, the substrate surface having the electrothermal transducer provided thereon is protected from sputter etching with the layer formed in the first sputtering step, and therefore film formation can be practiced at a high bias voltage necessary for obtaining a protective film having the desired function.

As the result, a bias sputtered layer having good step coverage and good function can be obtained. Moreover, the bias sputtered layer is also excellent in adhesion to the support side.

In forming the bias sputtered layer, the bias sputtering step may be practiced in two divided steps as described above, or it may be also divided into 3 steps or more, but even in such case, a bias sputtering step of a low voltage (50 V or lower in terms of absolute value) is used for formation of the layer constituting the contact surface with the support side. The problem of peel-off of the protective layer due to generation of cracks particularly at the step portion of, for example, a protective layer of multi layer structure having a bias sputtered layer and a layer comprising a high melting metal provided on the bias sputtered layer may be considered to be caused by the residual strain primarily within the bias sputtered layer, and such problem can be cancelled by relaxing the residual stress.

In other words, if the residual stress in the bias sputtered layer is high, this will act on the step portion which is structurally weak in adhesive force to give rise to cracks there, which may become the cause for peel-off. Besides, the thin film comprising a high melting temperature metal has great compression stress, and when a high melting temperature metal is laminated on the bias sputtered layer, the compression stress of the high melting temperature metal will act so as to increase the compression stress of the bias sputtered layer itself, whereby generation of such a defect will become more marked.

On the other hand, the problem regarding reliability in step stress test, etc. may be considered to be caused by the extent of the residual stress in the bias sputtered layer itself. More specifically, the step stress test is an acceleration test of heat cycle, and lowering in reliability in the test is caused primarily by peeling or cracking already occured in the protective layer, or peeling or cracking which is generated or progressed during the test. Accordingly, it may be considered that the peeling or cracking portion has been already formed during formation of the bias sputtered layer, or the layer is under the state susceptible to occurrence of these defects and that causes of these defects are related to the residual stress of the layer.

Therefore, by making the residual stress in the bias sputtered layer sufficiently small, these problems can be solved.

In the method of the present invention, after formation of a layer according to the bias sputtering method, the layer is subjected to an annealing treatment to remove the residual stress in the bias sputtered layer, whereby the above problem is cancelled.

In the present invention, by use of the bias sputtering method as described above, at least one layer constituting the protective layer is formed by using a material, for example, a metal oxide such as $SiO_2$, $TiO_2$, $WO_3$, $Ta_2O_5$ and others, a highly resistant nitride such as $Si_3N_4$, AΩN, etc. and other highly resistant semiconductors, etc.

The annealing treatment which is carried out after layer formation according to the bias sputtering method may be practiced by selecting suitably the heating conditions necessary for reducing effectively the residual stress in the bias sputtered layer as described above depending on the kind of the bias sputtered layer to be annealed or the operational conditions of the bias sputtering method used for its formation.

As the temperature condition, 300° C. or higher is desirable, preferably 400° C. or higher. The upper limit may be the temperature which the electrode material can stand.

In carrying out the annealing treatment, for prevention of thermal denaturation, etc., it is desirably conducted under an inert gas atmosphere such as $N_2$.

Furthermore, various investigations about the residual stress in the bias sputtered layer from the standpoint as described above, have been made, and consequently found that the above problems can be cancelled by setting the residual stress when the compressive stress is expressed in terms of a minus value at $-2.5\times10^9$ dyn/cm$^2$ or higher, to accomplish the present invention.

The above standpoint is described in more detail below by referring to the drawings.

Figure 2A:
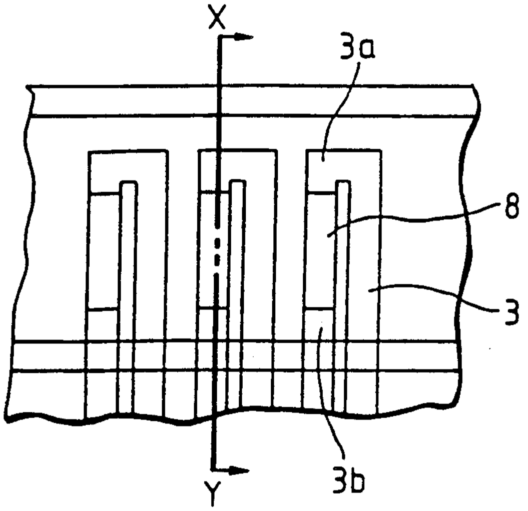
FIG. 2A is a schematic plan view for illustrating the principal portion of an example of the ink jet head in accordance with the present invention.
Figure 2B:
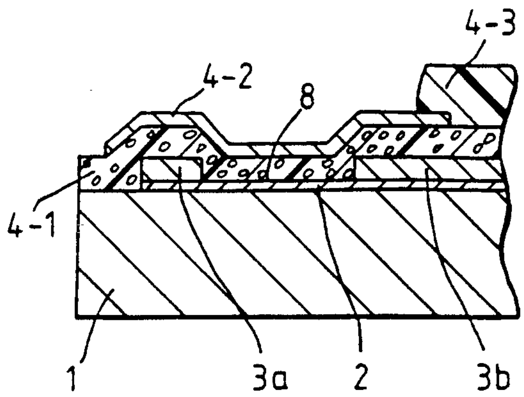
FIG. 2B is a schematic sectional view taken along the line X-Y in FIG. 2A for illustrating the principal portion of an example of the ink jet head in accordance with the present invention.

FIGS. 2A and 2B are schematic diagrams showing an example of the substrate for ink jet recording heads of the present invention, FIG. 2A showing a plan view of its principal part and FIG. 2B a partial sectional view along the line X-Y in FIG. 2A.

The substrate consists of an electrothermal transducer comprising a pair of electrodes 3*a*, 3*b* and a heat-generating resistor 2 provided on a support 1, and further layers 4-1, 4-2 and 4-3 as the protective layer.

As the substrate 1, the electrodes 3*a*, 3*b* and the heat-generating resistor 2, those used for formation of conventional substrates for ink jet recording can be utilized.

The layer 4-1 constituting the protective layer is formed by the bias sputtering method under the conditions necessary for making the residual stress therein when the compressive stress is expressed in terms of a minus value $-2.5\times10^9$ dyn/cm$^2$ or higher.

As the constituent material for the bias sputtered layer 4-1, there can be included, for example, $SiO_2$, $WO_3$, $Ta_2O_5$ and other metal oxides, highly resistant nitrides such as $Si_3N_4$, AΩN, etc.

As the layers 4-2, 4-3 other than the bias sputtered layer to be used for the protective layer, for example, a high melting temperature metal such as W, Mo, Ta, etc. is preferred for the 4-2 layer. For the 4-3 layer, an organic material such as polyimide is preferred.

Thin film formation is a quenching process under the condition of constraint of a thin film substance on the base plate in the process of forming thin film, and strain occurs within the thin film without effecting sufficient relaxation of atomic arrangement in spite of occurrence of volume change of the thin film substance, and this will bring about stress generation.

The residual stress ($\sigma$) as herein mentioned refers to the stress thus generated, and it can be determined by, for example, forming a thin film on a glass shaped in lengthy rectangular strip, measuring the warped amount of the glass and calculating according to the following formula:

$$\sigma = \frac{Eb^2}{3(1-\nu)\Omega^2}\cdot\frac{\delta}{d} \text{ (Stoney-Hoffmans's formula)}$$

E: Young's modulus of glass
$\nu$: Poisson's ratio of glass
b: Thickness of glass
Ω: Length of glass
d: Thickness of thin film
δ: Displacement of base plate tip end (warped amount of glass)

The operational conditions in the bias sputtering method to be used in the present invention may be suitably selected corresponding to the material to be used and the characteristics of the layer to be obtained, but, for example, sputtering power, sputtering gas pressure, bias voltage, etc. may be controlled so that the residual stress when the compressive stress is expressed in terms of a minus value may become $-2.5\times10^9$ dyn/cm$^2$ or higher. For example, the method developed by the present inventors as used in the Examples shown below is particularly useful.

The present invention is described in more detail by referring to Examples.

EXAMPLE 1

Figure 3A:
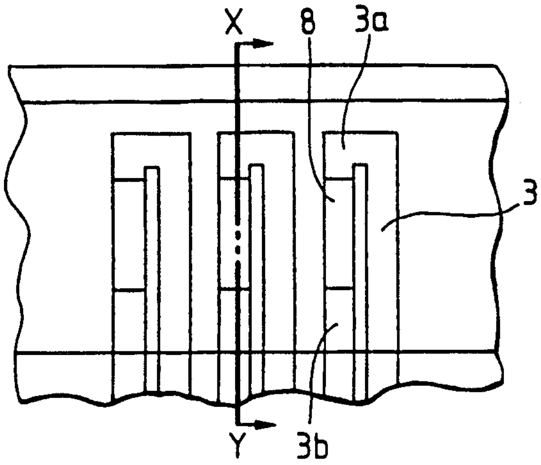
FIG. 3A is a schematic plan view for illustrating the principal portion of another example of the ink jet head in accordance with the present invention.
Figure 3B:
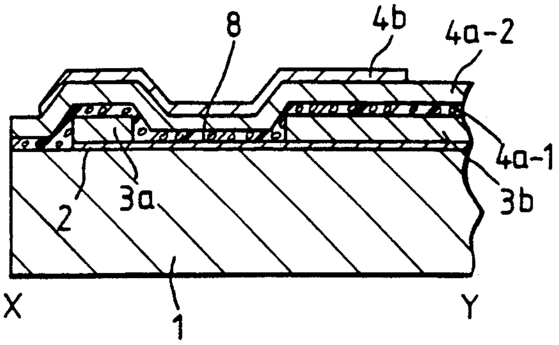
FIG. 3B is a schematic sectional view taken along the line X-Y in FIG. 3A for illustrating the principal portion of another example of the ink jet head in accordance with the present invention.

A substrate for an ink jet recording head having the constitution as shown in FIGS. 3A and 3B was prepared as described below.

Figure 4A:
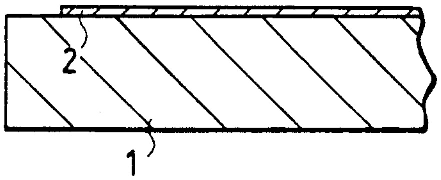
FIGS. 4A–4D are each schematic sectional views for showing the preparation steps of the ink jet head in accordance with the present invention shown in FIGS. 3A and 3B.

First, on a silicon wafer 1 as the support having a $SiO_2$ layer (5 μm) formed by heat oxidation on the surface was laminated $HfB_2$ as the heat-generating resistor layer 2 to a film thickness of 0.2 μm by the sputtering method (see FIG. 4A).

Figure 4B:
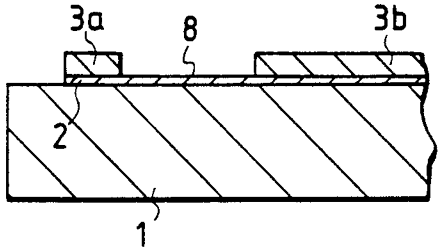

Next, AΩ was vapor deposited to a film thickness of 0.6 μm as the electrode layer 3, and further these layers were patterned by use of the photolithographic technique to form an electrothermal transducer having a heat-generating portion 8 provided between a pair of electrodes 3*a* and 3*b* (see FIG. 4B).

Subsequently, on the electrothermal transducer on the support 1, first a layer 4*a*-1 (film thickness 1 μm) comprising $SiO_2$ was laminated according to the bias sputtering method under the following conditions (see FIG. 4C).

Sputtering power: 7.6 W/cm$^2$
Bias voltage: −20 V
Sputtering gas species: Ar
Sputtering gas pressure: $5\times10^{-1}$ Pa
Substrate-target interval: 80 mm Next, a layer 4*a*-2 (film thickness 0.9 μm) comprising $SiO_2$ was laminated on the layer 4*a*-1 by the bias sputtering method under the same conditions as described above except for changing the bias voltage to −150 V (see FIG. 4D).

Further, a layer 4*b* (film thickness 0.6 μm) comprising Ta was laminated by sputtering to obtain a support for ink jet recording heads (see FIG. 3B).

Further, the above operations were repeated to prepare a large number of substrates for recording heads.

Next, substrates for ink jet recording heads were obtained in the same manner as described above except for changing both of the bias voltages during formation of the layers 4*a*-1, 4*a*-2 to −150 V.

For a large number of substrates thus obtained, step stress tests were conducted to evaluate them. The results for the samples extracted indiscriminately are shown in Table 1.

In the step stress test, a rectangular waveform of a frequency of 3 kHz and a pulse width of 10 μs was applied between a pair of electrodes while elevating gradually its voltage to measure the breaking voltage, and M was determined from the breaking voltage (Vth) according to the following formula:

$$M = Vth/Vb$$

Vb: bubbling voltage.

The value M determined from this formula indicates reliability of the electrothermal transducer of the substrate, representing the value used as the acceleration test of reliability in the product form, and the product is not so practically applicable if this value is 1.3 or lower.

TABLE 1

| Sample No. | 1st −20 V 2nd −150 V | only −150 V |
|---|---|---|
| 4 | 1.65 | 1.33 |
| 12 | 1.63 | 1.29 |
| 17 | 1.67 | 1.35 |

As is also apparent from the results in Table 1, in the substrates having the upper layer formed at high bias voltage from the initial point, current concentration is liable to occur locally in the electrothermal transducer, with M value being varied, even including M value of 1.3 or lower, whereby reliability of the product was inferior.

In contrast, in the substrates prepared according to the present invention according to a combination of low bias voltage and high bias voltage, there was little variance in M value, and they were confirmed to be substrates of high reliability.

Besides, defects of the upper layer such as peeling or crack were generated at extremely low ratio in the substrates prepared according to the present invention, and also step coverage thereof was good.

EXAMPLE 2

A substrate for an ink jet recording head having the constitution as shown in FIGS. 2A and 2B was prepared as described below.

Figure 5A:
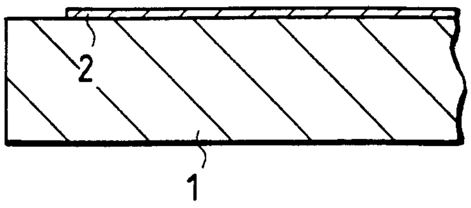
FIGS. 5A–5D are each schematic sectional views for showing the preparation steps of the ink jet head in accordance with the present invention shown in FIGS. 2A and 2B.

First, on a silicon wafer 1 as the support having a $SiO_2$ layer (5 μm) formed by heat oxidation on the surface was laminated $HfB_2$ as the heat-generating resistor layer 2 to a film thickness of 0.2 μm by the sputtering method (see FIG. 5A).

Figure 5B:
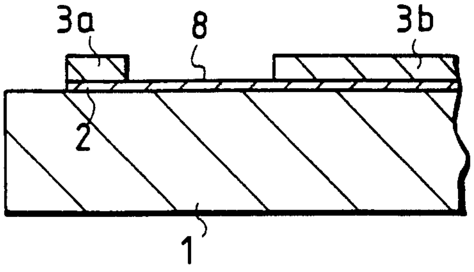

Next AΩ was vapor deposited to a film thickness of 0.6 μm to form electrode layer 3, and further these layers were patterned by use of the photolithographic technique to form an electrothermal transducer having a heat-generating portion 8 provided between a pair of electrodes 3*a* and 3*b* (see FIG. 5B).

Figure 5C:
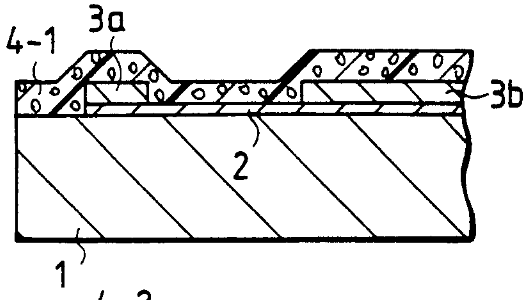

Subsequently, after a layer 4-1 (film thickness 1.0 μm) comprising $SiO_2$ was laminated according to the bias sputtering method on the electrothermal transducer on the support 1 under the following conditions, the layer was subjected to annealing treatment at 400° C., under nitrogen gas atmosphere for 60 minutes (see FIG. 5C).

Sputtering power: 7.6 W/cm$^2$
Bias voltage: −100 V
Sputtering gas species: Ar
Sputtering gas pressure: $5\times10^{-1}$ Pa
Base plate-target interval: 80 mm.

Figure 5D:
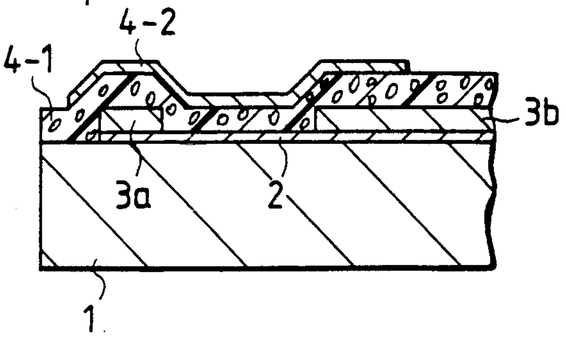

Next, a layer 4-2 (film thickness 0.6 μm) comprising Ta was laminated by the sputtering method on the layer 4-1 (see FIG. 5D), and further a polyimide layer (3.0 μm) as the layer 4-3 was laminated to obtain a substrate for ink jet recording heads (see FIG. 2B).

Further, the above operations were repeated to prepare a large number of substrates for recording heads.

Next, substrates for recording heads were obtained in the same manner as described above except that no annealing treatment was effected.

For a large number of substrates thus obtained, step stress tests were conducted for evaluation. The results are shown in Table 2.

The results shown in Table 2 are average values per 3 substrates.

EXAMPLE 3

A large number of substrates were prepared in the same manner as in Example 2 except that the bias voltage in the bias sputtering was made −200 V.

The evaluation results by the step stress test conducted in the same manner as in Example 2 are shown in Table 2.

EXAMPLE 4

A large number of substrates were prepared in the same manner as in Example 2 except that the sputtering power and the bias voltage were changed to 4.8 W/cm$^2$ and −200 V, respectively.

The evaluation results according to the step stress test conducted in the same manner as in Example 2 are shown in Table 2.

TABLE 2

| | Annealed | Not annealed |
|---|---|---|
| Example 2 | 1.75 | 1.29 |
| Example 3 | 1.70 | × |
| Example 4 | 1.69 | × |

note:
× indicates that film peeling occurred at the time when the second protective layer was prepared.

EXAMPLE 5

A substrate for an ink jet recording head having the constitution as shown in FIGS. 2A and 2B was prepared as described below.

First, on a silicon wafer 1 as the support having a $SiO_2$ layer (5 μm) formed by heat oxidation on the surface was laminated $HfB_2$ as the heat-generating resistor layer 2 to a film thickness of 0.2 μm by the sputtering method.

Next, AΩ was vapor deposited to a film thickness of 0.6 μm to form electrode layer 3, and further these layers were patterned by use of the photolithographic technique to form an electrothermal transducer having a heat-generating portion 8 provided between a pair of electrodes 3*a* and 3*b*.

Subsequently, on the electrothermal transducer on the support 1, a layer 4-1 (film thickness 1.0 μm) comprising $SiO_2$ was laminated by the bias sputtering method under the following conditions except that the sputtering power and the bias voltage were variously changed as shown in Table 3:

Sputtering gas species: Ar
Sputtering gas pressure: $5\times10^{-1}$ Pa
Base plate-target interval: 80 mm.

Next, on the layer 4-1 was laminated a layer 4-2 (film thickness 0.6 μm) comprising Ta by the sputtering method, followed by formation of a polyimide layer (3.0 μm) 4-3 to obtain a substrate for an ink jet recording head.

For a large number of substrates thus obtained, step stress tests were conducted for evaluation.

Separately, only the bias sputtered layer was formed on the glass substrate under the same conditions as described above, and its residual stress was measured according to the method as described above.

The values of residual stress when the compressive stress is expressed in terms of a minus value of the obtained bias sputtered layers and the results of evaluation by the step stress test are shown in Table 3.

EXAMPLE 6

Substrates were prepared in the same manner as in Example 5 except for using the bias sputtering method under the following conditions and changing variously the base plate-target distance in bias sputtering as shown in Table 4:

Sputtering power: 7.6 W/cm$^2$
Sputtering gas species: Ar
Sputtering gas pressure: $5\times10^{-1}$ Pa Bias voltage: −100 V.

Table 4 shows the evaluation results according to the step stress test and the residual stress measured values of the thus prepared substrates similarly obtained as in Example 5.

EXAMPLE 7

Substrates were prepared in the same manner as in Example 5 except for using the bias sputtering method under the conditions shown below and changing variously the sputtering gas pressure as shown in Table 5:

Sputtering power: 7.6 W/cm²
Sputtering gas species: Ar
Base plate-target interval: 80 mm
Bias voltage: −100 V.

Table 5 shows the evaluation results according to the step stress test and the residual stress measured values of the thus prepared substrates similarly obtained as in Example 5.

TABLE 3

| Bias voltage | Sputtering power 7.6 W/cm² | 4.8 W/cm² | 2.5 W/cm² |
|---|---|---|---|
| −15 V | ○ $-1.1 \times 10^9$ dyn/cm² | ○ $-0.9 \times 10^9$ dyn/cm² | ○ $-0.7 \times 10^9$ dyn/cm² |
| −100 V | Δ $-2.7 \times 10^9$ dyn/cm² | ○ $-2.0 \times 10^9$ dyn/cm² | ○ $-1.5 \times 10^9$ dyn/cm² |
| −200 V | × $-3.5 \times 10^9$ dyn/cm² | × $-2.9 \times 10^9$ dyn/cm² | ○ $-2.4 \times 10^9$ dyn/cm² |
| | Sputtering gas species | A r | |
| | sputtering gas pressure | $5 \times 10^{-1}$ Pa | |
| | Base plate - target distance | 80 mm | |

NOTE:
In evaluation of substrates, the case when the value of M exceeded 1.3 was rated as ○, the case when M is 1.3 or lower as Δ and the case when cracking was recognized during preparation of the layer 4-2 as ×.

TABLE 4

| Base plate-target distance | Results | Residual stress |
|---|---|---|
| 80 | Δ | $-2.7 \times 10^9$ dyn/cm² |
| 120 | ○ | $-1.5 \times 10^9$ dyn/cm² |
| Sputtering power | | 7.6 W/cm² |
| Sputtering gas species | | Ar |
| Sputtering gas pressure | | $5 \times 10^{-1}$ Pa |
| Bias voltage | | −100 V |

Results:
○: no problem
Δ: step stress test, M1.3 or less
×: cracking occurred during preparation of 2nd protective layer

TABLE 5

| Sputtering gas pressure | Results | Residual stress |
|---|---|---|
| 5 Pa | ○ | $-1.5 \times 10^9$ dyn/cm² |
| 1 Pa | ○ | $-2.5 \times 10^9$ dyn/cm² |
| $5 \times 10^{-1}$ Pa | Δ | $-2.7 \times 10^9$ dyn/cm² |
| Sputtering power | | 7.6 W/cm² |
| Sputtering gas species | | Ar |
| Baseplate-target distance | | 80 mm |
| Bias voltage | | −100 V |

Results:
○: no problem
Δ: step stress test, M1.3 or less
×: cracking occurred during preparation of 2nd protective layer

EXAMPLE 8

Figure 4C:
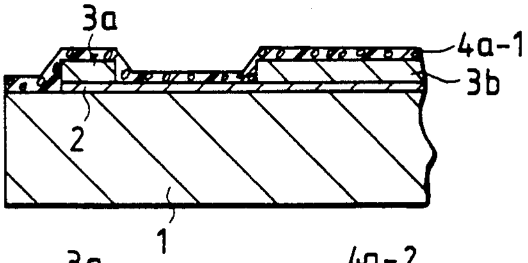
Figure 4D:
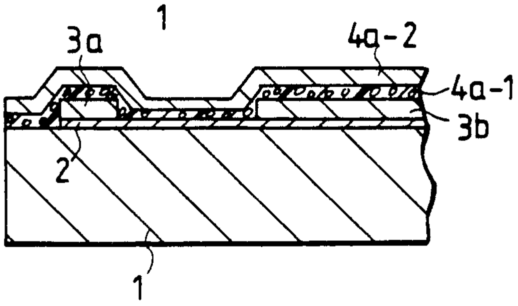

A substrate for ink jetting in accordance with the present invention was prepared in the same manner as in Example 1 with the exception that the bias voltage was not changed rapidly within a short time but changed gradually and continuously from −20 V to −150 V in transition from the step of FIG. 4C to the step of FIG. 4D.

Also in this example, a substrate for ink jetting having high reliability was able to be prepared.

EXAMPLE 9

A substrate for ink jetting in accordance with the present invention was prepared in the same manner as in Example 1 with the exception that the layer **4*b* shown in FIG. 3B** was not formed.

Also in this example a substrate for ink jetting having high reliability was able to be prepared.

EXAMPLE 10

A substrate for ink jetting in accordance with the present invention was prepared in the same manner as in Example 8 with the exception that the layer **4*b* shown in FIG. 3B** was not formed.

Also in this example a substrate for ink jetting having high reliability was able to be prepared.

EXAMPLE 11

A substrate for ink jetting in accordance with the present invention was prepared in the same manner as in Example 2 with the exception that the layer 4-2 shown in FIG. 2B was not formed.

Also in this example a substrate for ink jetting having high reliability was able to be prepared.

EXAMPLE 12

A substrate for ink jetting in accordance with the present invention was prepared in the same manner as in Example 2 with the exception that the layers 4-2 and 4-3 shown in FIG. 2B were not formed.

Also in this example a substrate for ink jetting having high reliability was able to be prepared.

EXAMPLE 13

A substrate for ink jetting in accordance with the present invention was prepared in the same manner as in Example 3 with the exception that the layer 4-2 shown in FIG. 2B was not formed.

Also in this example a substrate for ink jetting having high reliability was able to be prepared.

EXAMPLE 14

A substrate for ink jetting in accordance with the present invention was prepared in the same manner as in Example 3 with the exception that the layers 4-2 and 4-3 shown in FIG. 2B were not formed.

Also in this example a substrate for ink jetting having high reliability was able to be prepared.

EXAMPLE 15

A substrate for ink jetting in accordance with the present invention was prepared in the same manner as in Example 4 with the exception that the layer 4-2 shown in FIG. 2B was not formed.

Also in this example a substrate for ink jetting having high reliability was able to be prepared.

EXAMPLE 16

A substrate for ink jetting in accordance with the present invention was prepared in the same manner as in Example 4 with the exception that the layers 4-2 and 4-3 shown in FIG. 2B were not formed.

Also in this example a substrate for ink jetting having high reliability was able to be prepared.

EXAMPLE 17

A substrate for ink jetting in accordance with the present invention was prepared in the same manner as in Example 5 with the exception that the layer 4-2 shown in FIG. 2B was not formed.

Also in this example a substrate for ink jetting having high reliability was able to be prepared.

EXAMPLE 18

A substrate for ink jetting in accordance with the present invention was prepared in the same manner as in Example 5 with the exception that the layers 4-2 and 4-3 shown in FIG. 2B were not formed.

Also in this example a substrate for ink jetting having high reliability was able to be prepared.

EXAMPLE 19

A substrate for ink jetting in accordance with the present invention was prepared in the same manner as in Example 6 with the exception that the layer 4-2 shown in FIG. 2B was not formed.

Also in this example a substrate for ink jetting having high reliability was able to be prepared.

EXAMPLE 20

A substrate for ink jetting in accordance with the present invention was prepared in the same manner as in Example 6 with the exception that the layers 4-2 and 4-3 shown in FIG. 2B were not formed.

Also in this example a substrate for ink jetting having high reliability was able to be prepared.

EXAMPLE 21

A substrate for ink jetting in accordance with the present invention was prepared in the same manner as in Example 7 with the exception that the layer 4-2 shown in FIG. 2B was not formed.

Also in this example a substrate for ink jetting having high reliability was able to be prepared.

EXAMPLE 22

A substrate for ink jetting in accordance with the present invention was prepared in the same manner as in Example 7 with the exception that the layers 4-2 and 4-3 shown in FIG. 2B were not formed.

Also in this example a substrate for ink jetting having high reliability was able to be prepared.

EXAMPLE 23

A substrate for ink jetting in accordance with the present invention was prepared in the same manner as in Example 1 except for using $TiO_2$ in place of $SiO_2$ as the material of the layer **4*a*-1**.

Also in this example a substrate for ink jetting having high reliability was able to be prepared.

EXAMPLE 24

A substrate for ink jetting in accordance with the present invention was prepared in the same manner as in Example 2 except for using $WO_3$ in place of $SiO_2$ as the material of the layer 4-1.

Also in this example a substrate for ink jetting having high reliability was able to be prepared.

EXAMPLE 25

A substrate for ink jetting in accordance with the present invention was prepared in the same manner as in Example 3 except for using $Ta_2O_5$ in place of $SiO_2$ as the material of the layer 4-1.

Also in this example a substrate for ink jetting having high reliability was able to be prepared.

EXAMPLE 26

A substrate for ink jetting in accordance with the present invention was prepared in the same manner as Example 4 except for using $Si_3N_4$ in place of $SiO_2$ as the material of the layer 4-1.

Also in this example a substrate for ink jetting having high reliability was able to be prepared.

EXAMPLE 27

A substrate for ink jetting in accordance with the present invention was prepared in the same manner as in Example 5 except for using AlN in place of $SiO_2$ as the material of the layer 4-1.

Also in this example a substrate for ink jetting having high reliability was able to be prepared.

EXAMPLE 28

A substrate for ink jetting in accordance with the present invention was prepared in the same manner as in Example 6 except for using $WO_3$ in place of $SiO_2$ as the material of the layer 4-1.

Also in this example a substrate for ink jetting having high reliability was able to be prepared.

EXAMPLE 29

A substrate for ink jetting in accordance with the present invention was prepared in the same manner as in Example 6 except for using $Ta_2O_5$ in place of $SiO_2$ as the material of the layer 4-1.

Also in this example a substrate for ink jetting having high reliability was able to be prepared.

EXAMPLE 30

A substrate for ink jetting in accordance with the present invention was prepared in the same manner as in Example 1 with the exception that after the step of FIG. 4C, the layer **4*a*-1 is subjected to annealing treatment at 400° C. under nitrogen atmosphere for 60 minutes in advance of the step of FIG. 4D**.

Also in this example a substrate for ink jetting having high reliability was able to be prepared.

In an embodiment of the present invention including especially Example 1 as a typical example, in transition from the step of FIG. 4C to the step of FIG. 4D, the bias voltage need not necessarily be changed rapidly (in Example 1, changed from −20 V to −150 V) and may be changed gradually and continuously.

Furthermore, in an embodiment of the present invention including especially Example 1 as a typical example, better effects can be obtained by subjecting the bias sputtered layer to an annealing treatment.

Having described above the case when the bias sputtered layer was used for the layer 4-1 on the support side in an embodiment including especially Examples 2–7 as typical examples, the effect of the present invention can be obtained similarly also for the case when the bias sputtered layer is used for the layer 4-2. In such case, if annealing treatment and/or control of the residual stress of the bias sputtered layer are not done, the results of the step stress test become particularly bad, but such a problem can be effectively ameliorated by the annealing treatment and/or residual stress control of the bias sputtered layer.

As the layer other than the bias sputtered layer to be used for the protective layer in the present invention, it is possible to utilize one conventionally used for the protective layer of the substrates for recording heads such as those which can be formed into film by various film formation methods such as vapor deposition method, the sputtering method, etc. by use of a material such as a high melting temperature metal, for example, Ta, W, Mo, etc., or organic coatings such as polymide, polyiamide, polyimideamide, cyclized rubber, etc.

The substrates obtained by use of the method of the present invention in the Examples were bonded to a covering member 5 made of glass and having a recessed portion for forming a liquid path 6, a liquid chamber 10, etc. to prepare ink jet recording heads.

When recording test of the recording heads obtained was conducted, good recording could be practiced and durability was also good.

In the case where the substrate for ink jetting prepared in accordance with the present invention is utilized to prepare an ink jet head, specifically where the path having the liquid path 6 and the liquid chamber 10 as shown in FIG. 1 is to be formed, it is possible to form the wall of the path by using, for example, a photosensitive resin and then to bond the top plate to the member for forming the wall.

The method of the present invention is applicable to an ink jet recording head and a substrate to be used for forming the head of any constitution comprising an upper layer as the protective film having a layer formed by the bias sputtering method as a part of its constitution.

In the above examples, description has been made with reference to heads of the type where the direction of ink discharge through the discharge opening is substantially the same as the direction in which ink is supplied to the portion of the energy generating means in the liquid path.

However, the present invention is not limited to this type and is applicable to heads of the type where the above two directions are different from each other (e.g. those where the two directions are perpendicular to each other).

Further, in the present invention, the layer of heat generating resistor and the layer of electrodes may be provided in a reverse (upset) arrangement.

Figure 6:
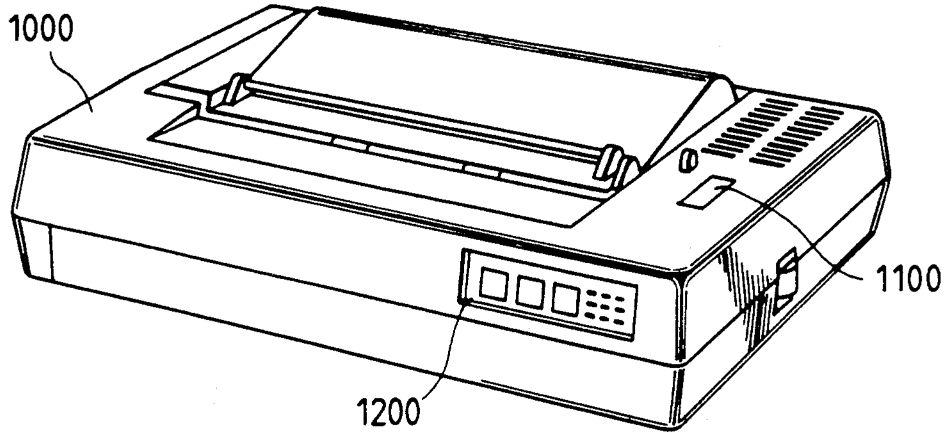
FIG. 6 is a schematic perspective view of the ink jet apparatus provided with the ink jet head in accordance with the present invention.

FIG. 6 is a schematic perspective view showing the appearance of a liquid jet apparatus equipped with the liquid jet head of the present invention. In FIG. 6, 1000 is the apparatus body, 1100 a power switch, 1200 an operation panel.

According to the present invention, the electrothermal transducer provided on the support is protected through the action of the layer bias sputtered at low voltage previously formed, thereby excluding the bad influence by bias sputtering, and yet by further addition of the bias sputtered layer at high voltage, and a process for preparing a substrate to be used for formation of the head an ink jet recording head provided with a protective layer having excellent coverage and adhesion as well as good function can be provided.

Moreover, according to the present invention, the residual stress of the bias sputtered layer which can become the cause for giving rise to the defect of protective layer can be effectively reduced by the annealing treatment, whereby there can be provided a process for preparing an ink jet recording head having excellent reliability and durability which utilizes fully the advantage of using the bias sputtering method and a process for preparing a substrate to be used for formation of the head.

Furthermore, according to the present invention, since the residual stress of the bias sputtered layer which can give rise to the defect of protective layer is controlled to be effectively reduced by its formation conditions, it becomes possible to provide a process for preparing an ink jet recording head having excellent reliability, durability and quality which has utilized fully the advantage of using the bias sputtering method and a process for preparing a substrate to be used for formation of the head.

I claim:

1. A process for preparing an ink jet head having a support, an electrothermal transducer provided on the support and having a heat-generating resistor and a pair of electrodes electrically connected to the heat-generating resistor, a first upper layer provided on the electrothermal transducer, a second upper layer provided on the first upper layer and a liquid path communicated with a discharge opening for discharging liquid and formed on the support so as to correspond to the heat-generating resistor portion of the electrothermal transducer formed between the pair of electrodes, wherein the method comprises the steps of:

forming the first upper layer using a bias sputtering method, wherein the absolute value of the bias voltage is 50 V or less and greater than 0 V; and forming the second upper layer using the bias sputtering method, wherein the absolute value of the bias voltage is higher than 50 V.

2. A process for preparing an ink jet head according to claim 1, wherein the absolute value of the bias voltage in the step of forming the first upper layer is 20 V or less.

3. A process for preparing an ink jet head according to claim 1, wherein the absolute value of the bias voltage in the step of forming the second upper layer is 70 V or higher.

4. A process for preparing an ink jet head according to claim 1, wherein the absolute value of the bias voltage in the step of forming the second upper layer is 100 V or higher.

5. A process for preparing an ink jet head according to claim 1, wherein the electrothermal transducer generates heat energy to be utilized for discharging liquid.

6. A process for preparing an ink jet head according to claim 1, wherein the liquid path is formed by providing a covering member having a recessed portion for forming the liquid path on the support.

7. A process for preparing an ink jet head according to claim 1, wherein the liquid path is formed by forming on the support a wall forming member for forming the wall of the liquid path and providing a top plate on the wall forming member.

8. A process for preparing an ink jet head according to claim 7, wherein the wall forming member is formed using a photosensitive resin.

9. A process for preparing an ink jet head according to claim 1, wherein the change in the absolute valve of the bias voltage between the step of forming the first upper layer and the step of forming the second upper layer is effected intermittently.

10. A process for preparing an ink jet head according to claim 1, wherein the change in the absolute valve of the bias voltage between the step of forming the first upper layer and the step of forming the second upper layer is effected continuously.

11. A process for preparing a substrate for an ink jet head having a support, an electrothermal transducer provided on the support and having a heat-generating resistor and a pair of electrodes electrically connected to the heat-generating resistor, a first upper layer provided on the electrothermal transducer and a second upper layer provided on the first upper layer, wherein the method comprises the steps of:

forming the first upper layer using a bias sputtering method, wherein the absolute value of the bias voltage is 50 V or less and greater than 0 V; and forming the second upper layer using the bias sputtering method, wherein the absolute value of the bias voltage is higher than 50 V.

12. A process for preparing a substrate for an ink jet head according to claim 11, wherein the absolute value of the bias voltage in the step of forming the first upper layer is 20 V or less.

13. A process for preparing a substrate for an ink jet head according to claim 11, wherein the absolute value of the bias voltage in the step of forming the second upper layer is 70 V or higher.

14. A process for preparing a substrate for an ink jet head according to claim 11, wherein the absolute value of the bias voltage in the step of forming the second upper layer is 100 V or higher.

15. A process for preparing a substrate for an ink jet head according to claim 11, wherein the change in the absolute value of the bias voltage between the step of forming the first upper layer and the step of forming the second upper layer is effected intermittently.

16. A process for preparing a substrate for an ink jet head according the claim 11, wherein the change in the absolute value of the bias voltage between the step of forming the first upper layer and the step of forming the second upper layer is effected continuously.

* * * * *

UNITED STATES PATENT AND TRADEMARK OFFICE
CERTIFICATE OF CORRECTION

PATENT NO. : 5,062,937 Page 1 of 2

DATED : November 5, 1991

INVENTOR(S) : HIROKAZU KOMURO

It is certified that error appears in the above-identified patent and that said Letters Patent is hereby corrected as shown below:

On the title page:
At [57] Abstract:

Line 5, "provided." should read --provided--.

COLUMN 2:

Line 14, "down" should read --reduction--.

COLUMN 6:

Line 43, "AΩN," should read --AℓN,--.

COLUMN 7:

Line 22, "AΩN," should read --AℓN,--; and

Line 45, "$\sigma = \frac{Eb^2}{3(1-v)\Omega^2} \cdot \frac{\delta}{d}$"

should read $$-- \sigma = \frac{Eb^2}{3(1-v)\ell^2} \cdot \frac{\delta}{d} --.$$

COLUMN 8:

Line 11, "AΩ" should read --Aℓ--.

UNITED STATES PATENT AND TRADEMARK OFFICE

CERTIFICATE OF CORRECTION

PATENT NO. : 5,062,937 Page 2 of 2

DATED : November 5, 1991

INVENTOR(S) : HIROKAZU KOMURO

It is certified that error appears in the above-identified patent and that said Letters Patent is hereby corrected as shown below:

COLUMN 9:

Line 28, "AΩ" should read --Aℓ--.

COLUMN 10:

Line 29, "AΩ" should read --Aℓ--.

COLUMN 15:

Line 29, "polymide," should read --polyimide--; and

Line 30, "polyiamide," should read --polyamide--.

COLUMN 17:

Line 15, "valve" should read --value--; and

Line 21, "valve" should read --value--.

Signed and Sealed this

Twenty-first Day of September, 1993

*Attest:*

BRUCE LEHMAN

*Attesting Officer* *Commissioner of Patents and Trademarks*